US006859914B2

(12) United States Patent
McConaghy

(10) Patent No.: US 6,859,914 B2
(45) Date of Patent: Feb. 22, 2005

(54) SMOOTH OPERATORS IN OPTIMIZATION OF CIRCUIT STRUCTURES

(75) Inventor: Trent Lorne McConaghy, Ottawa (CA)

(73) Assignee: Synopsys, Inc., Mountain View, CA (US)

( * ) Notice: Subject to any disclaimer, the term of this patent is extended or adjusted under 35 U.S.C. 154(b) by 85 days.

(21) Appl. No.: 10/227,859

(22) Filed: Aug. 27, 2002

(65) Prior Publication Data

US 2004/0044971 A1 Mar. 4, 2004

(51) Int. Cl.$^7$ .......................... G06F 17/50; G06F 19/00
(52) U.S. Cl. ....................... 716/4; 716/1; 716/2; 716/3; 716/5; 700/121
(58) Field of Search ............................. 716/4, 2, 3, 1, 716/5; 700/121

(56) References Cited

U.S. PATENT DOCUMENTS

| | | | | |
|---|---|---|---|---|
| 4,935,877 A | * | 6/1990 | Koza | 706/13 |
| 5,136,686 A | * | 8/1992 | Koza | 706/13 |
| 5,148,513 A | * | 9/1992 | Koza et al. | 706/13 |
| 5,237,514 A | * | 8/1993 | Curtin | 716/10 |
| 5,255,345 A | * | 10/1993 | Shaefer | 706/13 |
| 5,418,974 A | * | 5/1995 | Craft et al. | 716/2 |
| 5,495,419 A | * | 2/1996 | Rostoker et al. | 700/121 |
| 5,557,533 A | * | 9/1996 | Koford et al. | 716/9 |
| 5,682,322 A | * | 10/1997 | Boyle et al. | 716/2 |
| 5,802,349 A | * | 9/1998 | Rigg et al. | 716/2 |
| 5,867,397 A | * | 2/1999 | Koza et al. | 703/14 |
| 6,360,191 B1 | * | 3/2002 | Koza et al. | 703/6 |
| 6,408,428 B1 | * | 6/2002 | Schlansker et al. | 716/17 |
| 6,519,749 B1 | * | 2/2003 | Chao et al. | 716/9 |
| 6,587,998 B2 | * | 7/2003 | Rodeh | 716/5 |
| 6,651,222 B2 | * | 11/2003 | Gupta et al. | 716/1 |
| 2003/0131323 A1 | * | 7/2003 | McConaghy | 716/2 |

OTHER PUBLICATIONS

K. Shahookar et al., A Genetic Approach to Standard Cell Placement Using Genetic Parameter Optimization, IEEE Transactions on Computer–Aided Design of Integrated Circuits and Systems, pp. 500–511, May 1990.*
S. Mohan et al., Wolverines: Standard Cell Placement on A Network of Workstations, IEEE Transaction on Computer–Aided Design of Integrated Circuits and Systems, pp. 1312–1326, Sep. 1993.*
S. Mohan et al., Wolverines: Standard Cell Placement on A Network of Workstations, European Design Automation Conference, pp. 46–51, Sep. 1992.*

* cited by examiner

*Primary Examiner*—A. M. Thompson
(74) *Attorney, Agent, or Firm*—Bever, Hoffman & Harms, LLP; Jeanette S. Harms

(57) ABSTRACT

A method of identifying semiconductor design candidates from a population of semiconductor technology designs leverages specialized operators which are smooth in the sense that the operators are capable of producing small changes in the performance or behaviour when applied to a design to modify it. The method includes determining a smooth operator for effecting incremental structural change to a semiconductor technology design when the smooth operator is applied to the semiconductor technology design and then applying the smooth operator to at least one semiconductor technology design in the population to determine an updated population. The semiconductor technology designs in the updated population are evaluated to identify a preferred semiconductor technology design candidate. If the stopping condition is satisfied then the search terminates otherwise the steps are repeated.

10 Claims, 13 Drawing Sheets

Performance value

SMOOTH OPERATORS IN OPTIMIZATION OF CIRCUIT STRUCTURES

FIELD OF THE INVENTION

The present invention relates generally to electronic design automation (EDA). More particularly, the present invention relates to semiconductor technology design.

BACKGROUND OF THE INVENTION

The problem of structural optimization is to find improved or optimal structural designs from a space of possible structural designs. There is a means to evaluate the performances of each candidate design. A search algorithm traverses the design space getting feedback from the performance measures in order to propose new designs. To traverse the design space, the algorithm applies "operators" that take one or many designs and produce another design from those designs.

In the problem domain of schematic-level circuit design, a point in the design space is a circuit topology with its associated component parameters. A circuit topology is characterized by the components that it includes (e.g. resistors, capacitors) and the interconnections among those components. Other problem domains in circuit design include layout-level circuit design.

One way to define the space of possible designs is to begin with initial designs and include all the designs reachable through the application of a finite number of operators. In traditional optimization problems, the design space typically only contains parameters, not structures. This can be called the problem of "parameter optimization." Operators in parameter optimization only vary the parameters of the design, not the structure. An example parameter optimization problem in circuit design is to find the values for device parameters (e.g. resistances, capacitances) of a given circuit schematic that give the best possible performance measures (e.g. power consumption, bandwidth). In structural optimization, there are also one or more structural operators. These operators actually alter the structure of a candidate design.

A simple example of a structural operator from the domain of schematic-level circuit design is merely to remove a randomly chosen component and leave an open circuit in its place. Structural optimization has benefits over parameter optimization for the reason that the design space is broadened to include different possible structures. With a broader design space than parameter optimization, there is the potential for even better designs to be achieved. Unfortunately, structural optimization is typically very inefficient because it takes large amounts of computational effort to optimize structures. A major reason for the inefficiency is that when structural changes are made (i.e. structural search operators are applied), there is typically a low probability of improving the performance measure of the design.

Generally, structural operators are "non-smooth" operators because they typically result in large changes in design behaviour. A non-smooth operator has typically been designed without consideration of the effects that parameters have on changes in behaviour in the specific domain of application. Applying a non-smooth operator typically leads to non-negligible changes in behaviour. So, on average, expected changes in behaviour are high. Large changes in behaviour usually lead to large changes in performance measures. The larger an expected change in a performance measure, the lower the expected probability of successfully improving the measure.

In the circuit design domain for example, consider the application of the non-smooth operator in which a transistor is randomly removed and open circuited. In all likelihood, the circuit's behaviour in terms of its electrical characteristics (voltages and currents in the circuit) will be radically changed. A large change in the electrical behaviour likely means a large change in the subsequent performance measure, e.g. a large change in open loop gain. With such a large change in open loop gain, there is a small likelihood that the change has been for the better. Successful changes to the circuit's structure are thus rare.

The main benefit of structural optimization over parameter optimization is the ability to create better designs, given enough time, because the scope of possible designs is larger. Unfortunately, structural optimization is too computationally expensive for many applications.

SUMMARY OF THE INVENTION

It is an object of the present invention to mitigate the high computational cost associated with structural optimization.

This invention seeks to eliminate or mitigate these undesirable effects by providing a method of search that uses at least one structural operator specially designed to have a higher probability of successfully improving performance than traditional structural operators.

Advantages of the invention include: the invention can yield better designs than inefficient structural optimization with the same computational effort; the invention can design the same quality of design as inefficient structural optimization but with less computational effort; compared to parameter optimization, the invention can yield better designs, with a more acceptable computational effort than inefficient structural optimization.

A smooth operator is an operator that is explicitly designed to cause, on average, small changes in design behaviour, such that the changes have a much higher probability of successfully improving the performance measures of the design, as compared to a non-smooth operator.

To explicitly design operators that have small expected changes in design behaviour, the key insight is: parameters and structures are closely intertwined. We devise operators that modify a structure, but manage related parameters in a relevant domain-specific manner such that the design's overall change in behaviour is expected to be negligible.

An example smooth operator in the circuit domain is to add a resistor with large resistance across an open circuit. A large resistor has only negligible difference in comparison to an open circuit. Thus, the new resistor likely has just a small effect. Therefore the expected change in the electrical behaviour of the circuit is negligible—current and voltage levels will likely be very close. This is in contrast to a non-smooth operator, for example, naively adding a resistor of randomly chosen resistance across an open circuit which would cause a large expected change in the circuit's behaviour.

According to an aspect of the present invention, there is provided a method of identifying preferred semiconductor technology design candidates from a population of semiconductor technology designs, the method comprising: determining a smooth operator for effecting incremental structural change to a semiconductor technology design when the smooth operator is applied to the semiconductor technology design, applying the smooth operator to a at least one semiconductor technology design in the population to determine an updated population; evaluating the semiconductor technology designs in the updated population to identify at least one preferred semiconductor technology design as the design candidate; and determining whether the at least one preferred semiconductor technology design candidate satisfies a stopping condition.

According to another aspect of the present invention, there is provided a method of identifying preferred semiconductor technology design candidates from a population of semiconductor technology designs, the method comprising: initially seeding the population of semiconductor technology designs with at least one seed semiconductor technology design; determining a set of operators for application to the population of semiconductor technology designs, each operator transforming a semiconductor technology design to a modified semiconductor technology design when the operator is applied to the semiconductor technology design, the set of operators including at least one smooth operator for effecting incremental structural change to a semiconductor technology design; applying at least one operator from the set of operators to at least one semiconductor technology design in the population to determine an updated population; evaluating the semiconductor technology designs in the updated population to identify at least one preferred semiconductor technology design candidate; determining whether the at least one preferred semiconductor technology design candidate satisfies a stopping condition; and if the stopping condition is not satisfied, repeatedly further applying operators and evaluating resulting updated populations until the stopping condition is satisfied.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention relates to smooth structural operators, and their application in the semiconductor technology design domain. By the expression "semiconductor technology" we include technologies relating to semiconductor products including schematic-level circuits and the related manufacturing processes.

Figure 1:
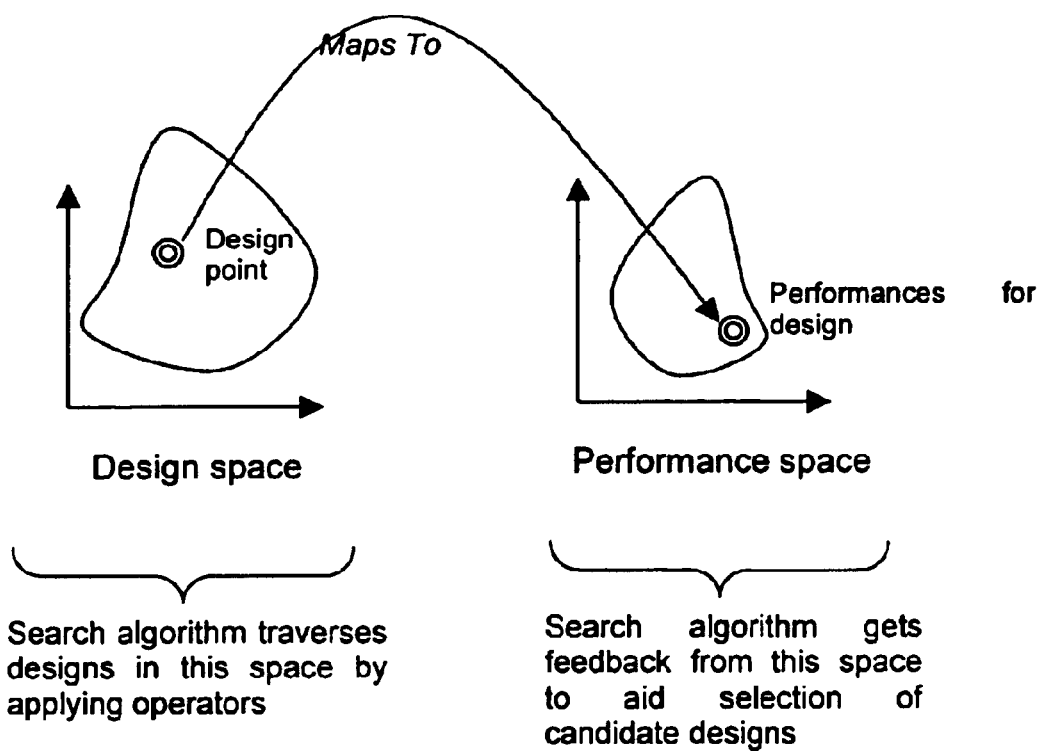
FIG. 1 illustrates the mapping of design space to performance space.

In an optimization problem, there is a mapping from design space to performance space. The design space is the space of all possible designs. The performance space is the space of possible performances. See FIG. 1. For example, in the circuit design domain: the design is the schematic, which includes components such as resistors, their parameters such as resistances, and how they are connected; performance measures with corresponding design goals may include, for example, minimizing power consumption and maximizing open loop gain.

Figure 2:
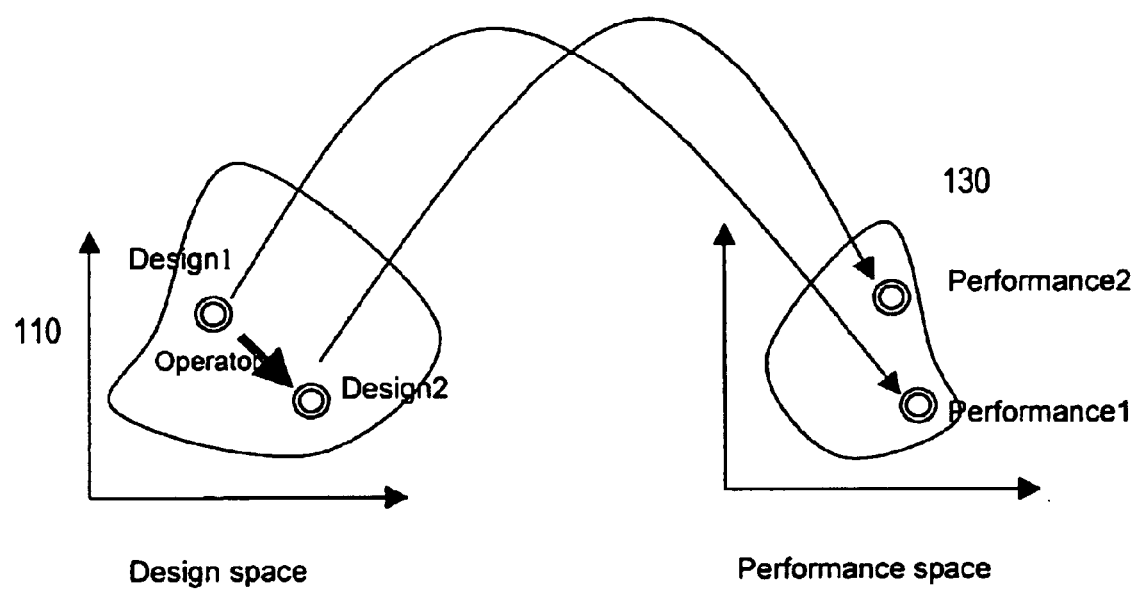
FIG. 2 illustrates the application of an operator to a design in design space to obtain improved performance in performance space.

A search algorithm is used in the optimization problem to traverse the design space, to find designs with improved performance measures. The algorithm traverses by applying operators to step from one or more designs to arrive at new designs. The algorithm uses feedback from the performance values measured to aid its selection of designs during the search. The application of an operator resulting in a design with improved performance can be considered a "successful" step. See FIG. 2.

Figure 3:
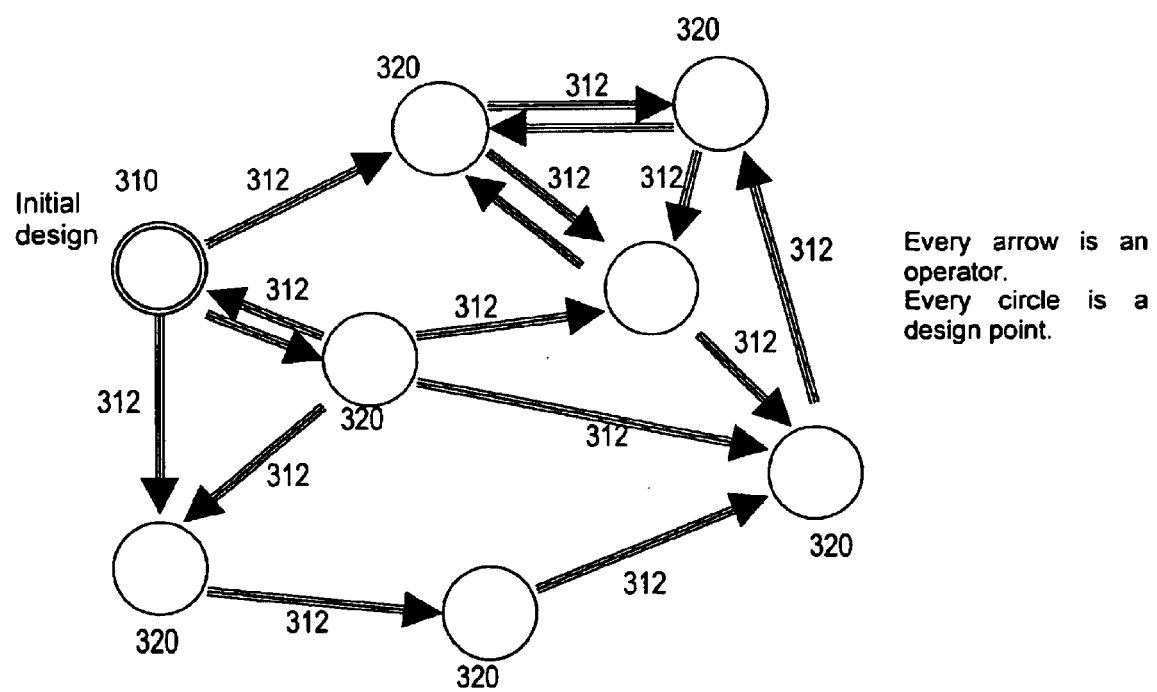
FIG. 3 illustrates design space as a directed graph having nodes which represent designs, and arcs between nodes representing operators on the designs.

If we consider operators that only operate on one design, then we can visualize the design space as a directed graph. As a graph, the nodes or lattice points in the space represent designs, and the arcs between nodes correspond to operators for the transformation of one design into another. Each design point has a corresponding set of performance measures. The search algorithm will be traversing this graph. See FIG. 3.

We now describe the payoff of having the ability to take small steps in the design space. First we present how parameter optimizers leverage this ability, and then we present how this ability is beneficial from a more search-theoretic point of view. If an algorithm were not able to achieve particular step sizes, then it would have limited control over its step size. Specifically, if small steps are not possible, then the algorithm will have control limitations. By contrast, if small steps can be taken, then larger steps can be constructed by merely congregating together a series of small steps. Thus, the most important step size to have control over is the small step size.

Parameter optimizers are implicitly built for small step sizes: a small parameter step is simply a smaller numerical change than a large step. Almost all parameter optimization algorithms leverage this distinction about step size as part of their core optimization. For example, gradient-based optimizers need to know step size in order to compute gradients; parameter-optimizing evolutionary algorithms have a higher probability of taking smaller steps than larger steps, e.g. with Gaussian mutation functions. Without the ability to control their step size, most parameter optimization algorithms lose the insights upon which they were designed. This has a direct impact on their search effectiveness. If in a worst case, parameter step size were random, most parameter search algorithms would actually degenerate into random search. The efficiency of parameter optimizations is therefore highly dependent on their ability to have tight control over varying their step size, which necessitates being able to take small steps.

We now examine the payoff of being able to take small steps from a searceh-theoretic point of view. In particular, we motivate the desire to get small changes in performance measures. Let us first define what we mean by a small step: If an operator can usually produce small changes in performance measures, then that operator can be considered a small step, i.e. smooth operator. Small steps get defined in terms of their effect. Thus, an application of a smooth operator will usually bring a small change in performance value. Rephrased: As the size of an operator's step approaches zero, the expected change in performance approaches zero.

In optimization theory, it is known that as the change in the performance measure approaches zero, then the probability of that performance measure improving (i.e. probability of success) approaches 0.5. This is under the assumption that the relation between the design space and the performance has better-than-random structure in it, a reasonable assumption for real-world problems. This result can be readily understood in that: as the change approaches zero, then the performance function approximates a linear plane. Exactly half of the possible steps with size approaching zero would be improvements in the performance measure.

Thus, the probability of success of an operator approaches 0.5 as the size of the operator's step size approaches 0. This is an important result in its optimism: a sufficiently small step has a good chance of improving a circuit. We have seen that the payoff of having the ability to take small steps in the design space means that we gain tighter control over step size, and therefore tighter control over optimization and ultimately better efficiency. Conversely, poor control over step size can degenerate to random search.

Figure 4:
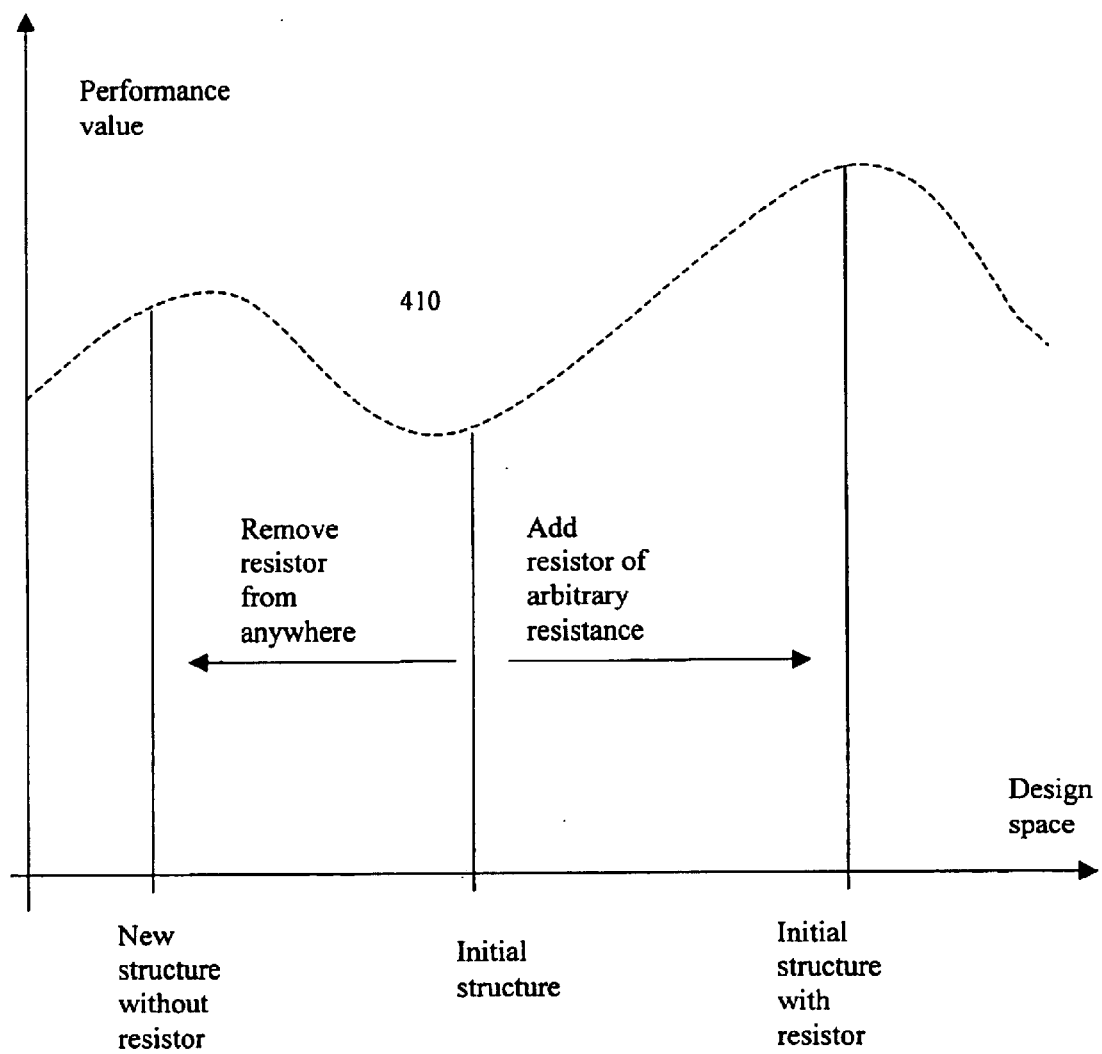
FIG. 4 illustrates the step size of non-smooth structural operators.

Now we first show how traditional structural optimization has poor control over step size, and then we describe a generalized technique for resolution of control, i.e. the basis of smooth operators. In structural optimization, operators are typically designed in a manner so that there is no distinction between "small" or "large" operator steps. It is typically assumed that all structural steps have an expected large change in performance measure, which turns out to be the case because of the technique in designing structural operators. The current technique is, in essence: there is no technique. There has not previously been insight into how to actually achieve "small steps", i.e. smooth operators. Therefore, there has been no way to get control over the step size of structural operators. This means that in the best case, the expected change in performance measures are high and probability of success is low; in the worst case structural optimization runs degenerate into random search. In either case, traditional structural search is inefficient. FIG. 4 illustrates the size of such non-smooth structural steps.

In explicitly designing smooth structural operators the key insight is: parameters and structures are closely intertwined with respect to "behaviour." Let us examine "behaviour" a little more closely. One can imagine an intermediate step in the mapping from design space to performance space, though rarely explicitly considered. That mapping step is the "behaviour." The behaviour is a function of the given designs, but has not yet been abstracted into performance measures as needed by a performance engine. See FIG. 5

For example, in the circuit design domain, the behaviour is the electrical behaviour, i.e. descriptions of quantities of voltage across components and current at nodes. This intermediate mapping step of behaviour was ignored in the design of non-smooth structural operators. What happened then was the following: when a structural operation was applied, even the behaviour of the design would usually change greatly. If that changed greatly, then usually the performance would change greatly, and the probability of success would be low.

Figure 5:
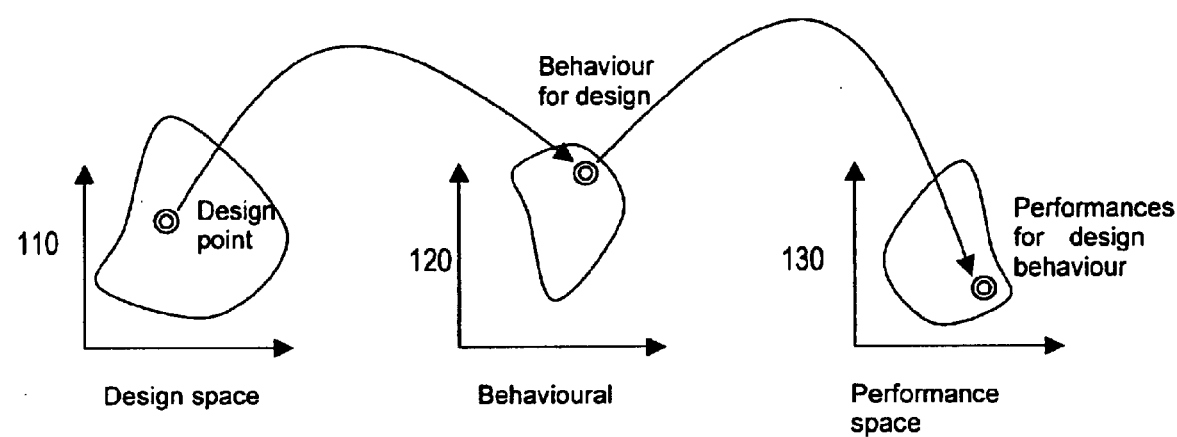
FIG. 5 illustrates an intermediate mapping step showing the behaviour for a design.

Accordingly, to design smooth structural operators, we devise ways to modify a structure, but manage related parameters in a relevant domain-specific manner such that the design's overall change in behaviour is expected to be negligible. Referring to FIG. 5, operators are typically designed taking just design space 510 into account, including "non-smooth" operators. The intermediate behavioural space 520 is typically not considered as it can "hide" within performance space 530. Smooth structural operators are designed by explicitly acknowledging behavioural space 520, and known domain-specific relations between changes in design space 510 and consequent expected changes in behavioural space 520.

Put another way, smooth operators change the structure of the design but roughly maintain the "semantics" of the design. In contrast, non-smooth operators are typically ignorant of the semantics. By explicitly taking domain-specific knowledge into account, we are designing structural operators with a small expected change in behaviour. This is in contrast to non-smooth operators, which by this point already have a large expected change in behaviour.

An example smooth structural operator in the circuit domain is to add a resistor with large resistance across an open circuit. A large resistor has only negligible difference as compared to an open circuit. Thus, the new resistor likely has just a small effect. Therefore the expected change in the electrical behaviour of the circuit is negligible—current and voltage levels will likely be very close. This is in contrast to a non-smooth operator, which would naively add a resistor of randomly chosen resistance, across an open circuit. In turn, that would cause a large expected change in the circuit's behaviour.

Figure 6:
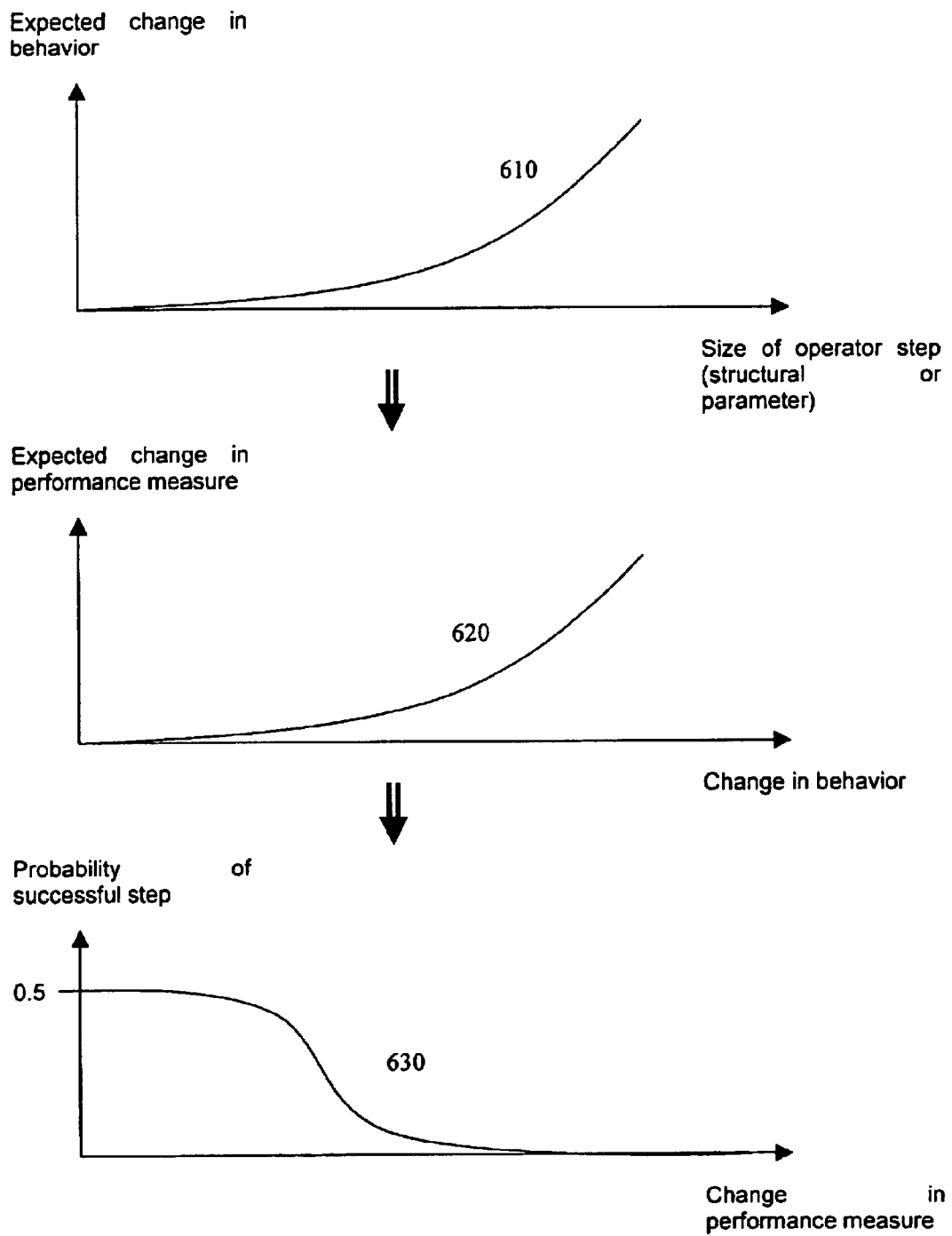
FIG. 6 illustrates the relationship between the size of an operator step and expected change in behaviour; the relationship between the change in behaviour and the expected change in performance; and the relationship between change in performance and the probability of a successful step.

Thus, we can achieve small expected changes in behaviour when applying smooth structural operators. A small expected change in behaviour means a small expected change in performance measures, which means a higher probability of a successful steps. FIG. 6 illustrates. At the core, we achieve the ability to take small structural steps. With small structural steps we win back control over step size in structural searches, as compared to using non-smooth operators. Having this fine-grained control often leads to improved search efficiency and final solution quality.

Figure 7:
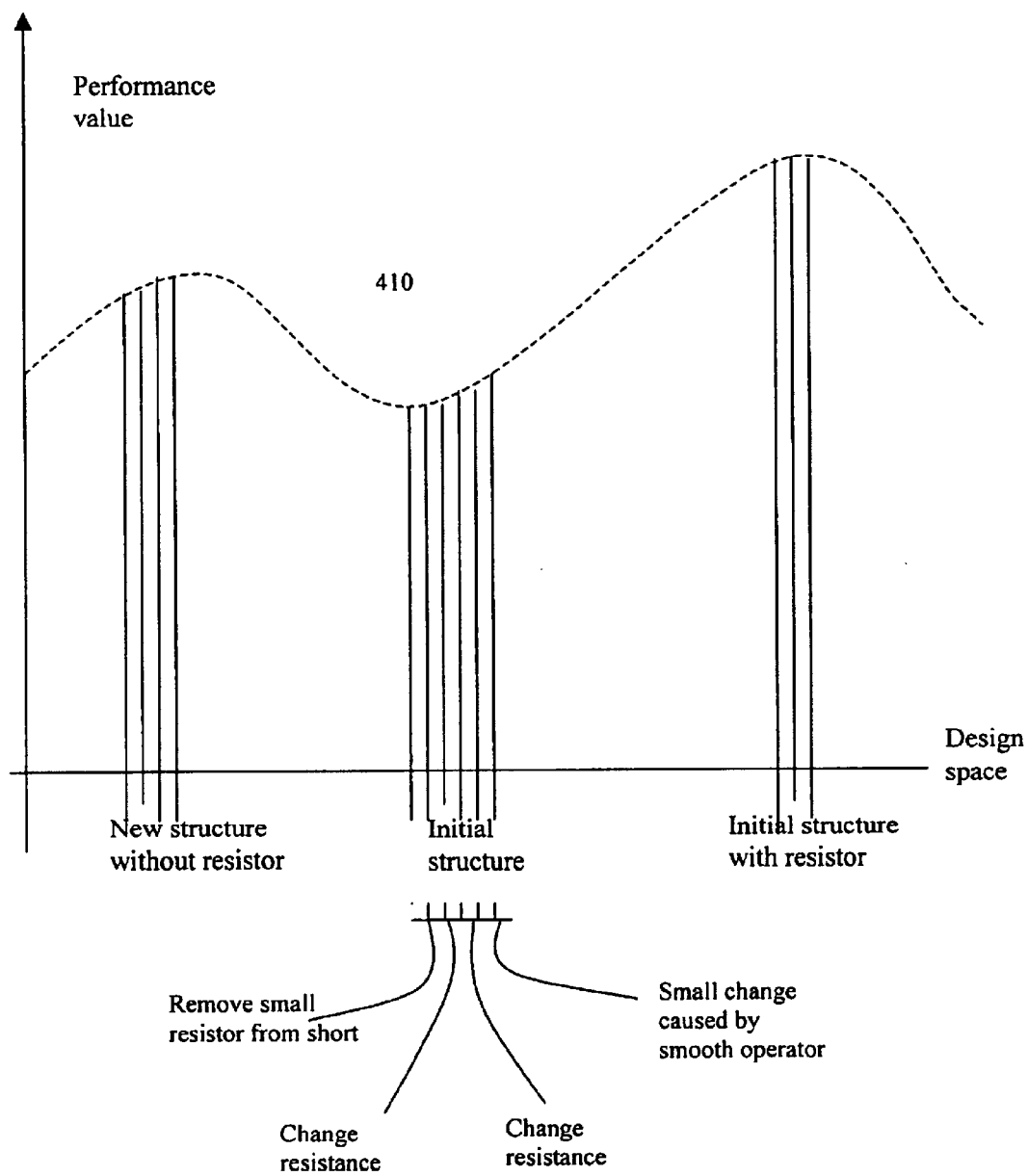
FIG. 7 illustrates how smooth structural operators can complement parameter changing operators.
Figure 8:
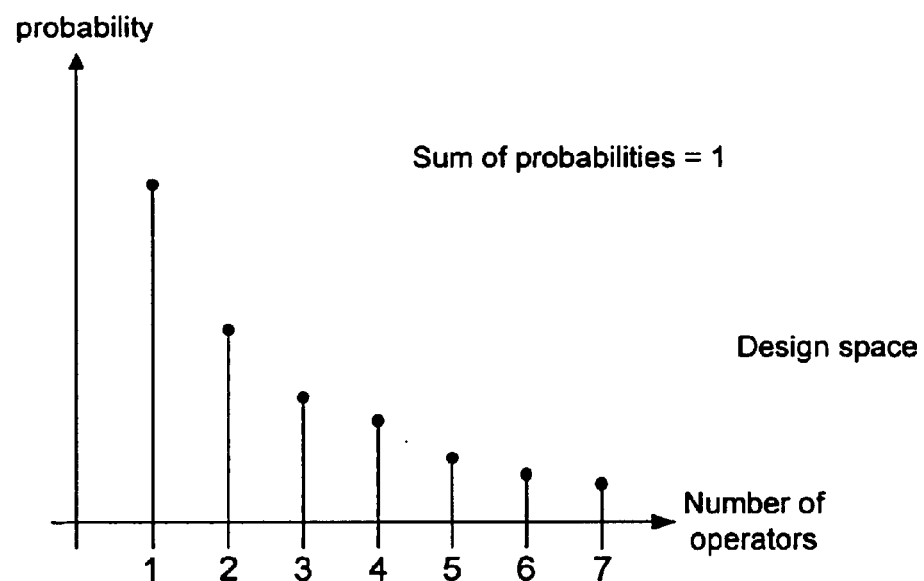
FIG. 8 illustrates an example probability distribution used to determine the number of operators to apply in a step consisting of one or more operators.

Smooth structural operators are complementary to parameter-changing operators. When a component is "added", we can "carry on" in that direction by changing the parameter values of the added component if the algorithm is designed to do so. When a component is "removed", we cannot "carry on" further. This works well in general for smooth operators in all domains. See FIG. 7. We can, of course, still take larger steps by aggregating operators. An example scheme would be to have a pool of possible smooth parameter operators and smooth structural operators. The number of operators to apply is chosen according to a probability distribution, for example as shown in FIG. 8. Each application of an operator would involve randomly choosing an operator from the pool and applying it to the design.

The high-level approach for leveraging smooth operators for structural optimization to a new problem domain can be broken into a series of steps, as follows:

1. Define the problem generally, e.g. how to measure performance
2. Devise operators based on design "behaviour" for that domain 3. Embed the structural operators into the chosen optimization system
4. Define the problem specifically, e.g. performance targets
5. Apply the structural optimization system, starting from one or more seeds.

Of course, another high level approach for leveraging smooth operators is merely re-using the existing system which already has the operators designed and embedded:
1. Define the problem generally, e.g. performance targets
2. Apply the structural optimization system, starting from one or more seeds.

Figure 9:
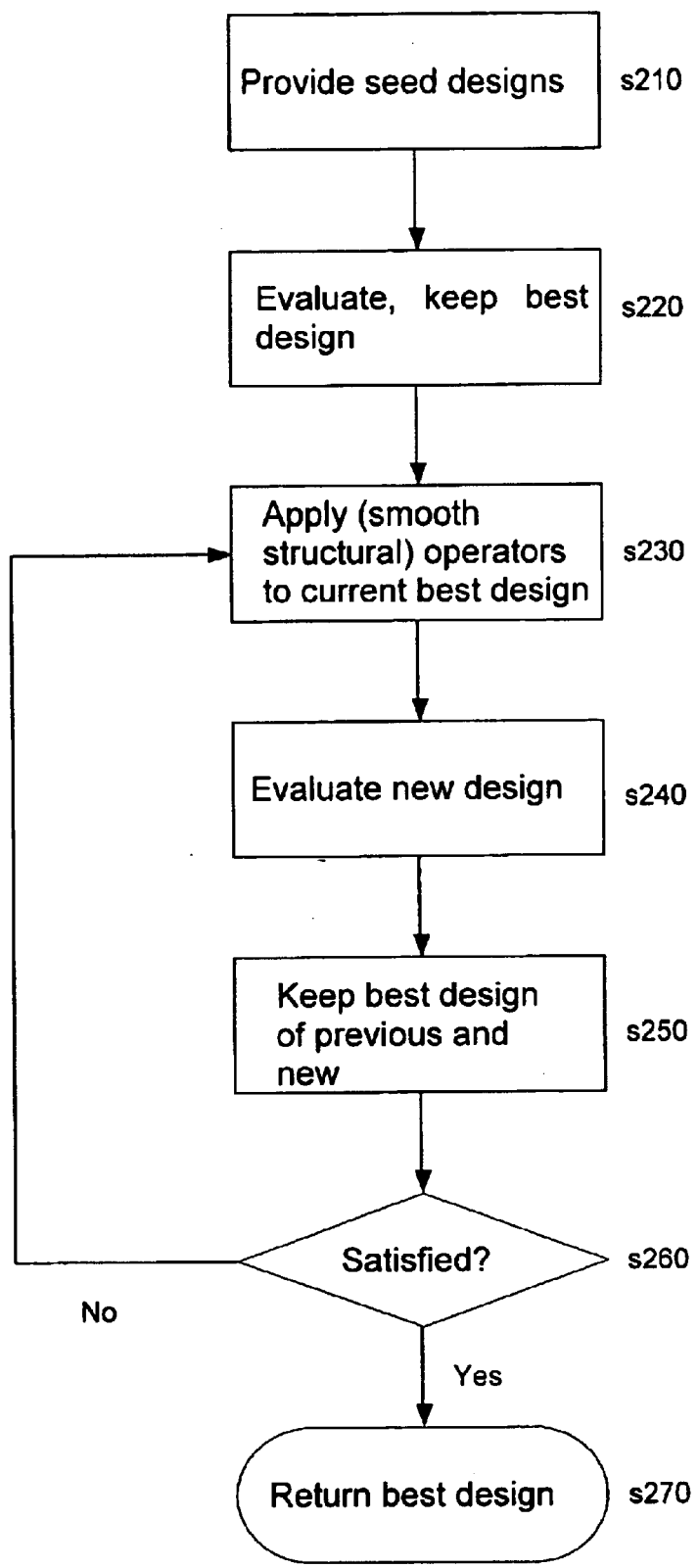
FIG. 9 illustrates the steps of a search engine incorporating smooth operators of the present invention.

We now describe an example structural optimization algorithm that has smooth structural operators embedded within it. This corresponds to FIG. 9. Initially, seed designs are provided (s210). The performances of the seed designs are evaluated, and the best design is selected (s220). Then, one or more operators (including at least one smooth one sometimes) are applied to the selected design resulting in a new design (s230). The performance of the new design is evaluated (s240). If the new design is better than the previous best, it is kept as the best design and the previous best is discarded; otherwise the new design is discarded and the previous best is maintained (s250). If this design satisfies a stopping criterion (s260) then the best design is returned as the search result (s270); otherwise, the method re-loops back to the step of applying the operators (s230). In some embodiments, the stopping criterion can comprise a resource limitation, such as a limit to the number of times the method loops, a limitation to the amount of computation time to be expended, or a limitation on the amount of elapsed time permitted.

We now give an example of the application of the high-level approach in the domain of circuit design. The first step is to determine what performances to measure, and how to measure them. The performance chosen was power consumption. Measurement structures are set up for use with a circuit simulator. The next step is to devise operators, which, with the seeds, will define the design space. For example, parameter operators chosen were to change resistance values from 10 to 20 Mohms and vice-versa. Since the problem is in the circuit domain, it is known that large resistors are almost the same as open circuits. Therefore the smooth structural operators chosen simply to involve adding a large resistor (10 Mohm) across an open circuit, and removing a large resistor leaving it open-circuited.

Figure 10:
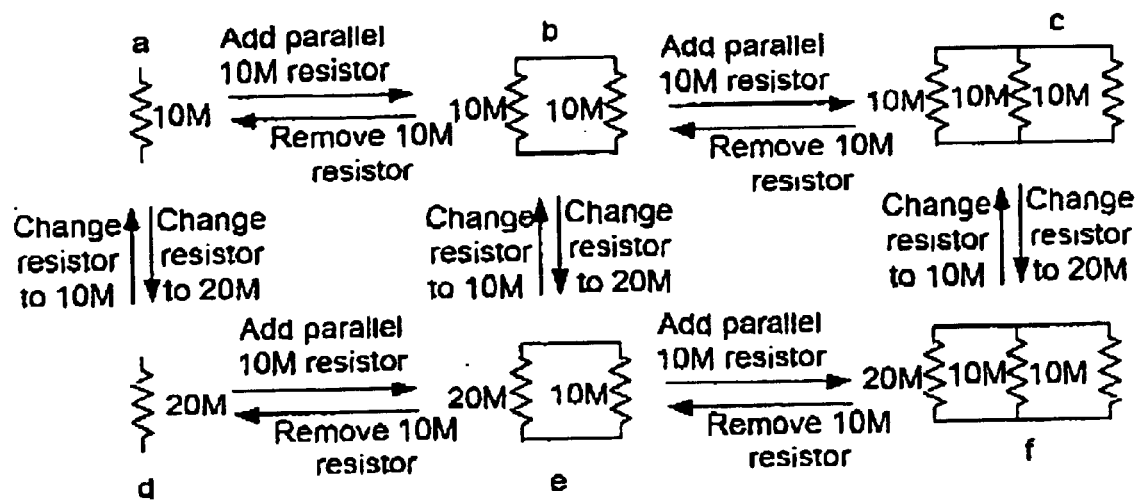
FIG. 10 illustrates an example of operators applied to circuit designs.

Consider the example of FIG. 10 in which the search space is a resistor seed a consisting of a single 10 Mohm resistor plus the following operators, which can be applied up to two times.
1. Add 10 Mohm resistor in parallel
2. Change 10 Mohm resistor into 20 Mohm resistor
3. Change 20 Mohm resistor into 10 Mohm resistor
4. Remove resistor.

resulting in the partal design space shown in FIG. 10 consisting of designs "b" to "f"

The next design step involves embedding the operators into the chosen structural optimization system. If the system is not built this would be the time to do so. The next step is to define the rest of the problem. In this case we stated that we wanted to get power consumption <100 mW. Now we are ready to execute the final step of the high-level process, which involves running the structural optimization system, e.g. according to FIG. 9. The structural optimization engine reads in the seed. It evaluates the seed with respect to power consumption. The engine proceeds by applying parameter and structural operators to the seed to produce a new design. The new design is evaluated for power consumption. The new design turns out to be worse than the old, so the new is discarded and the old is kept. This process of application of operators and subsequent evaluation is repeated, producing new designs at each repetition with the winning design being selected each time. Once the stopping criteria is hit (e.g. power consumption target satisfied) the optimization engine will stop optimizing and return the final, best result.

The following is an example of applying the high-level methodology plus the algorithm to a problem in the domain of circuits. The first step was to define the problem generally. The problem was to structurally optimize a current mirror at the schematic level. A current mirror essentially takes an input current and tries to "mirror" it as best as possible with another output current. The performance measure used is the difference between the input and mirrored signals' currents, i.e. the mean-squared error. This measure is created by applying a particular test stimuli to the circuit and measuring the input and output signals.

The operators devised for this domain are as follows, increase/decrease a resistor's resistance by a small fixed amount, replace an open circuit with a large (10 Mohm) resistor and vice versa, replace a short circuit with a small (10 Ohm) resistor and vice versa, and replace a resistor with a transistor of equivalent resistance for a particular frequency and vice versa. These operators are described in greater detail elsewhere in this document.

Figure 11:
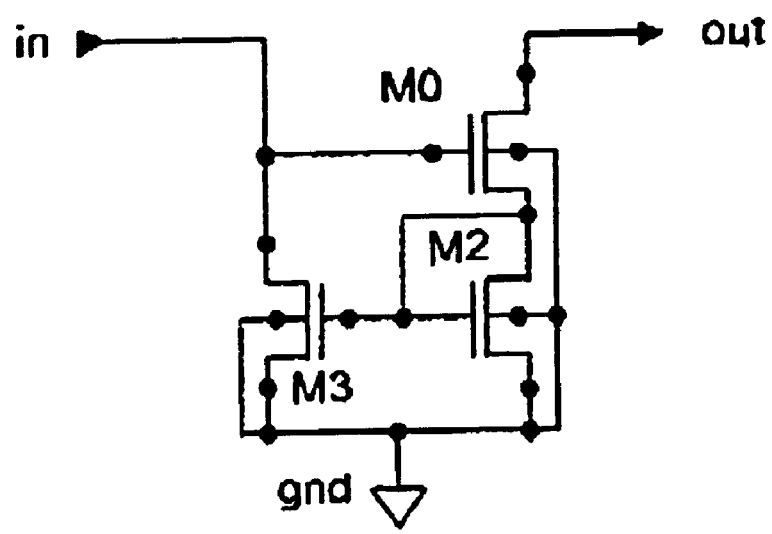
FIGS. 11 to 13 illustrate an example of the present invention in the domain of circuit design.

The next step was to embed the structural operators into the chosen optimization system, which already existed as a piece of software residing on a computer system. The operators were embedded as new modules of code that would be called by the structural optimization software as its search operators. The problem was defined more specifically. In this case, it was merely: The goal is to minimize the mean-square error. The next step was to apply the structural optimization. The seed was as shown in FIG. 11. The output of this application was a new structure, optimized from the seed.

The following is the example continued, within the operations of the specific structural optimization algorithm implemented in software as a structural optimization system. The abstract version of these steps are in FIG. 9. The input to the optimization system is the seed, as already seen in FIG. 11. This particular topology is known as a "Simple Wilson Current Mirror."

Figure 12:
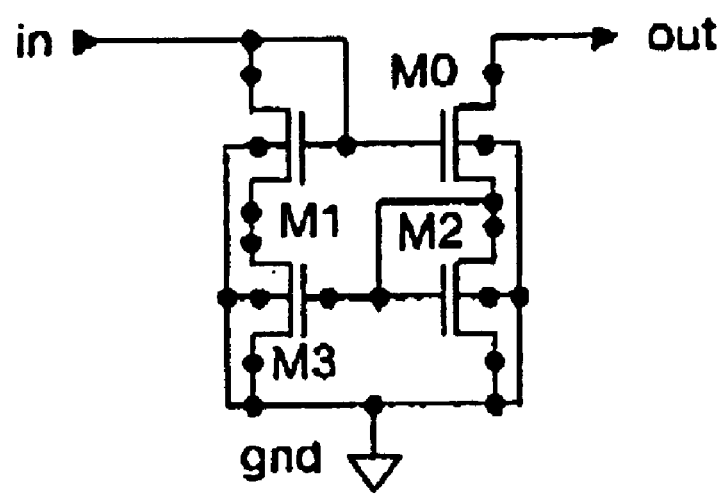

The seed was then evaluated. This was done by running a circuit simulator that created an input stimuli and simulated the circuit, to produce output signals. These output signals were compared to the desired output signals, and a mean-squared error in their difference was computed, i.e. the performance measure. The seed got re-labeled as the "best design so far." The next step was to apply one or more operators to the design. The algorithm in this case was designed to just apply one randomly chosen operator. The operator chosen was to randomly add a big resistor across an open circuit; it was applied to the input and output nodes, thus producing a new candidate design that was just like the seed, except with a big resistor between the input and output nodes. The next step was to evaluate the new candidate design. Its mean-squared error was measured. The next step was to compare the mean-squared error of the new design to the best design so far. The new design had higher error than the best design so far. Therefore, the new design was discarded and the best design so far was remembered. The next step was to identify if the search criteria were satisfied so that the search could stop. The desired mean-squared error target was not hit, so therefore the search had to be continued, by re-looping back to the step of applying operators. The next step was to apply one or more operators. The operator chosen was to replace a short circuit with a low-impedance transistor (i.e. a transistor with small length and large width). This was applied to produce a new circuit design, as shown in FIG. 12. Incidentally, this particular topology is known as a "Wilson Current Mirror."

Figure 13:
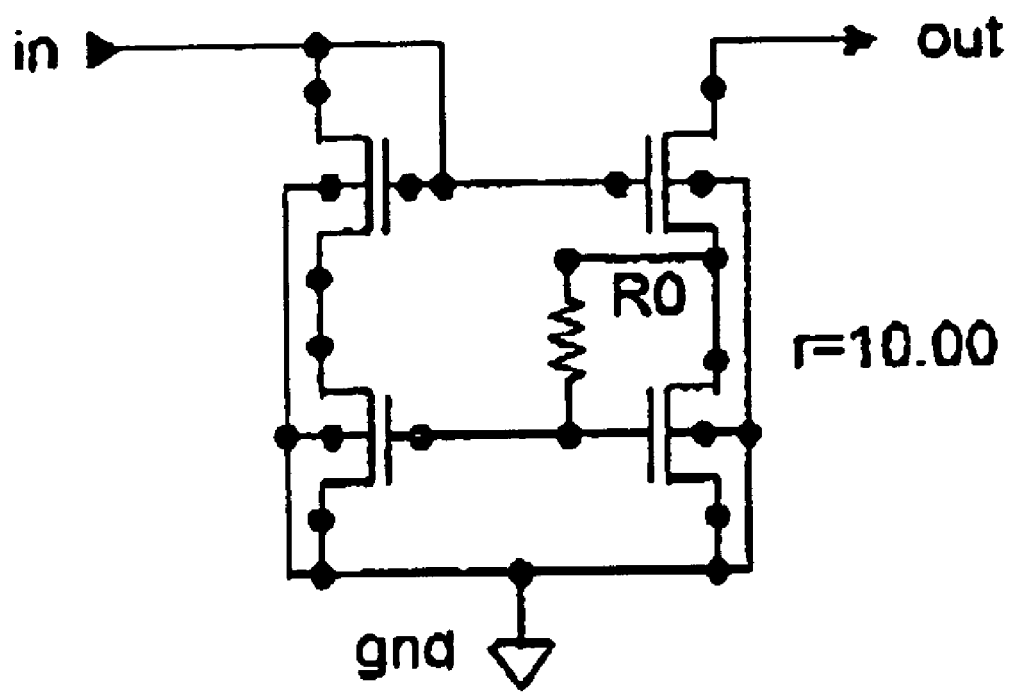

The new circuit design was then evaluated, i.e. its mean-squared error was measured. In this case, the new circuit had lower mean-squared error than the previous best circuit. So, it became the new "best circuit" and the old "best circuit" was discarded. The search was still not satisfied, so the system re-looped back to the step of applying operators. The next operator randomly chosen was to replace a short circuit with a small resistor. This was applied to produce a new circuit design, as shown in FIG. 13. The new design was evaluated; it was compared to the previous best; the new design won, so it became the new "best design." The search was still not satisfied, so the system re-looped.

The next operator randomly chosen was to increase the width of a transistor. This was applied to the bottom right transistor. The new design was evaluated; it was compared to the previous best; the new design lost, so it was discarded and the old previous best design remained as the best design. The search was still not satisfied, so the system re-looped. The next operator chosen was to increase the resistance of a resistor. This was applied to the sole resistor. The new design was evaluated; it was compared to the previous best; the new design won, so it became the new "best design." The search was still not satisfied, so the system re-looped. The next operator was to decrease the length of a transistor. This was applied to the bottom left transistor. The new design was evaluated; it was compared to the previous best; the new design lost, so it was discarded and the old previous best design remained as the best design. The search was still not satisfied, so the system re-looped. The next operator chosen was to increase the resistance of a resistor. This was applied to the sole resistor. The new design was evaluated; it was compared to the previous best; the new design won, so it became the new "best design." The search was still not satisfied, so the system re-looped. After many more re-loops, there had been many successful increases in the resistor's resistance, such that the best design's resistor had a very large resistance.

The performance measure (mean-squared error) was now sufficiently low that it satisfied the search's termination criteria. So, the system did not re-loop. Rather, it returned the best design, and the search terminated. The technique of smooth operators can be embedded into a variety of possible algorithms, because they are just a unique set of operators that are devised to provide particular advantages. The only requirements are: they must be general enough to work with structural operators, and there is a means of comparing goodness of designs with each other. Algorithms that can use smooth structural operators, therefore, include: greedy hill climbing, evolutionary algorithms, tabu search, simulated annealing, A-teams, many others, and combinations thereof.

We first discuss some examples of non smooth operators in schematic-level circuit design. A simple example of a non-smooth operator is to add a component, e.g:
  add in parallel: each port on the new component is connected to an existing net;
    parameters are chosen randomly
  add in series: a net is broken into two, with at least one tentacle on each net. A pair of ports is selected on the new component, and connected to the two new nets; parameters are chosen randomly Next, consider a non-smooth removal of a component. Any resulting dangling tentacles must be and any non-dangling tentacles may be connected together into one or more new or existing nets. Ports that are labelled as pairs are more likely to be connected upon removal. The expected corresponding change in goals is large. Another non-smooth operator is non-smooth rewire. Some examples include:
  Split a net: Any net that connects four or more ports is a candidate to be split into two nets.
  Join two nets: Any two nets can be merged into a single net.

When designing smooth operators for the circuit problem domain we specifically consider the relation of the components' values to the electrical circuit behaviour. In general, certain component/parameter combinations are almost like open circuits, which "plug" the flow of electricity; and other component/parameter combinations are almost like short circuits, which allow electricity to flow freely. We leverage such combinations.

We now consider nearly open/closed smooth operators in which we add components across open circuits to make the added component "almost behave like" an open circuit, and add components across short circuits to make the added component "almost behave like" a short circuit. These will keep the "step size" small, because the circuit's electrical characteristics will barely change.

Some examples of components and settings that are almost an open circuit include:
  a large resistor
  a capacitor (only at DC)
  an inductor (only at high frequencies)
  a transistor in an "open switch configuration" in which the gate connected to a net that biases the transistor off. To help, we can have a small W/L ratio to maximize the impedance of the transistor (i.e. largest-possible R for a transistor, but still comparatively small)
  an op amp with near-zero gain; try to make the output and input "almost" isolated from each other; either put the—input to ground or the + input to power. Assume that power and ground on op amp hook to global power and ground.
  a filter (only at the frequencies that it filters out). For example, a lowpass filter that only lets extremely low frequencies through; a bandpass filter in which the band or bands are very narrow; a notch filter in which the notch or notches are very wide; a highpass filter that only lets extremely high frequencies through
  user-defined Some examples of components and settings that are almost a closed circuit include:
  a small resistor
  a capacitor (only at high frequencies)
  an inductor (only at DC)
  a transistor in an "always on configuration", in which the gate connected to a net biases the transistor on. Also, the transistor has largest-possible W/L ratio to minimize impedance
  an op amp with a gain of 1.0; try to make the output and input signals "almost" short-circuited to each other; try to make all the impedances minimal. Assume that power and ground on op amp hook to global power and ground.
  a filter (only at the frequencies that it does not filter out). For example, a lowpass filter that lets all but the very highest frequencies through; a bandpass filter in which the band or bands are very wide; a notch filter in which the notch or notches are very narrow; a highpass filter that lets all but the very lowest frequencies through user-defined Examples of simple add and remove operations include:

add a (component/setting) that is almost an open circuit across a previously open circuit add a (component/setting) that is almost a short circuit across a previously short circuit (previous wire or net)

Examples of parallel/series add/remove operations include:

add any component in series with any component that is almost an open circuit remove any component in series with any component that is almost an open circuit add any component in parallel with any component that is almost a short circuit remove any component in parallel with any component that is almost a short circuit Next, consider automated circuit layout, which involves the problem of automatically placing polygon-like components onto an floorspace, and routing wires between those components, to maximize, minimize or meet specific design goals such as minimizing area and obeying specific technology design rule constraints such as overlap rules.

An example of a non-smooth operator is placing a component of randomly-chosen or nominally-chosen profile (e.g. rectangle with length and width) onto the floorspace. A smooth equivalent is placing a component with a profile of minimally-chosen area onto the floorspace. An example of a non-smooth operator is removing a component of any profile from the floorspace. A smooth approximate equivalent is only removing components with minimal profiles. An example of a non-smooth operator is moving the long, narrow bars of a wire (a wire connects ports between two components) from one route in one region on the floorspace to a different route on another region of the floorspace. A smooth equivalent is slightly narrowing the wire in one region and starting another very thin wire in another region. (One may wish to put extra constraints in to minimize the number of "split" wires).

The above-described embodiments of the present invention are intended to be examples only. Alterations, modifications and variations may be effected to the particular embodiments by those of skill in the art without departing from the scope of the invention, which is defined solely by the claims appended hereto.

I claim:

1. A method of identifying a preferred semiconductor technology design candidate from a population of semiconductor technology designs, the method comprising steps of:

(a) selecting a smooth structural operator, the smooth structural operator being expected to produce a substantially negligible behavioural change when applied to any of the population of semiconductor technology designs;

(b) applying the smooth structural operator to at least one of the population of semiconductor technology designs to generate an updated population of semiconductor technology designs;

(c) evaluating a predetermined performance measure for each of the updated population of semiconductor technology designs to identify at least one preferred semiconductor technology design candidate; and (d) repeating steps (b) to (c) until a stopping condition is satisfied.

2. The method of claim 1, wherein the stopping condition is satisfied when an evaluated performance measure of the at least one preferred semiconductor technology design candidate meets or exceeds a predetermined value.

3. The method of claim 1, wherein determining the smooth structural operator comprises determining a plurality of smooth structural operators for effecting substantially negligible behavioural changes to semiconductor technology designs.

4. The method of claim 1, wherein applying the smooth structural operator to the at least one semiconductor technology design in the population comprises applying a plurality of smooth structural operators in sequence.

5. The method of claim 1, wherein the stopping condition comprises a resource limitation.

6. The method of claim 5, wherein the resource limitation is a limit to the repetition of steps (b) to (c).

7. The method of claim 5, wherein the resource limitation is a limit to expendable computation time.

8. The method of claim 1, wherein the steps (a) to (d) are automated in a search engine.

9. The method of claim 1, further including initially seeding the population of semiconductor technology designs with at least one seed semiconductor design.

10. A computer program product for automatedly identifying a preferred semiconductor technology design candidate from a population of semiconductor technology designs, comprising:

at least one smooth structural operator, the smooth structural operator being expected to effect substantially negligible behavioural change when applied to any of the population of semiconductor technology designs;

means for applying the smooth structural operator to at least one of the population of semiconductor technology designs to generate an updated population of semiconductor technology designs;

means for evaluating a predetermined performance measure for each of the updated population of semiconductor technology designs to identify at least one preferred semiconductor technology design candidate; and means for determining whether the at least one preferred semiconductor technology design candidate satisfies a stopping condition.

* * * * *